United States Patent
Chinnadurai et al.

(10) Patent No.: US 8,825,272 B1
(45) Date of Patent: Sep. 2, 2014

(54) ALTERNATOR AND STARTER TESTER WITH CAPACITIVE ELEMENT

(71) Applicant: Service Solutions U.S. LLC, Warren, MI (US)

(72) Inventors: Manokar Chinnadurai, Owatonna, MN (US); Garrett Miller, Owatonna, MN (US)

(73) Assignee: Bosch Automotive Service Solutions LLC, Warren, MI (US)

( * ) Notice: Subject to any disclaimer, the term of this patent is extended or adjusted under 35 U.S.C. 154(b) by 0 days.

(21) Appl. No.: 13/797,088

(22) Filed: Mar. 12, 2013

(51) Int. Cl.
- G06F 19/00 (2011.01)
- G01R 31/00 (2006.01)
- G01R 31/34 (2006.01)
- G01R 31/36 (2006.01)

(52) U.S. Cl.
CPC ............ G01R 31/007 (2013.01); *G01R 31/343* (2013.01); *G01R 31/34* (2013.01); *G01R 31/3627* (2013.01)
USPC .......... 701/29.6; 701/22; 701/32.8; 701/33.4; 701/34.1; 701/34.4; 701/36; 180/65.285; 320/104

(58) Field of Classification Search
CPC .... G01R 31/007; G01R 31/343; G01R 31/34; G01R 31/3627; G01R 31/3648; G01R 31/3693; G01R 31/24; B60W 30/192; B60W 20/00; B60W 20/50; B60W 50/0205; F02B 63/04; F02B 63/00; H02K 27/00; G05B 15/02; B60L 2240/429; H05B 37/03; H05B 41/2925
USPC ............... 701/29.1, 22, 34.1, 115, 32.8, 33.4, 701/34.4, 36; 702/113, 183, 184, 185; 73/114.59; 320/104; 180/65.265, 180/65.285

See application file for complete search history.

(56) References Cited

U.S. PATENT DOCUMENTS

| | | | | |
|---|---|---|---|---|
| 6,777,945 | B2 * | 8/2004 | Roberts et al. | 324/426 |
| 6,988,053 | B2 * | 1/2006 | Namaky | 702/183 |
| 7,218,117 | B2 * | 5/2007 | Roberts et al. | 324/402 |
| 7,235,977 | B2 * | 6/2007 | Koran et al. | 324/426 |
| 7,990,155 | B2 * | 8/2011 | Henningson | 324/429 |
| 8,125,229 | B2 * | 2/2012 | Makhija et al. | 324/426 |
| 8,467,984 | B2 * | 6/2013 | Gering | 702/63 |
| 2003/0194672 | A1 * | 10/2003 | Roberts et al. | 431/196 |
| 2004/0054503 | A1 * | 3/2004 | Namaky | 702/183 |
| 2004/0108855 | A1 | 6/2004 | Raichle | |
| 2004/0230356 | A1 * | 11/2004 | Namaky | 701/29 |
| 2006/0244456 | A1 * | 11/2006 | Henningson et al. | 324/378 |
| 2007/0152702 | A1 | 7/2007 | Raichle et al. | |
| 2009/0039898 | A1 * | 2/2009 | Raichle et al. | 324/538 |
| 2010/0106361 | A1 | 4/2010 | Thibedeau et al. | |
| 2010/0170944 | A1 | 7/2010 | Raichle et al. | |
| 2011/0288789 | A1 * | 11/2011 | Henningson | 702/33 |
| 2013/0297247 | A1 * | 11/2013 | Jardine | 702/113 |
| 2013/0325405 | A1 * | 12/2013 | Miller et al. | 702/183 |

* cited by examiner

Primary Examiner — McDieunel Marc
(74) Attorney, Agent, or Firm — Baker & Hostetler LLP

(57) ABSTRACT

A diagnostic system configured to test the performance of a vehicle component may include a processor configured to process test information from the vehicle component and control the vehicle component to be tested. The system may also include a memory configured to store the test information of the vehicle component and software that operates the vehicle component and a capacitive element configured to supply power to perform the testing of the vehicle component, wherein the memory and the capacitive element are in communication with the processor.

20 Claims, 6 Drawing Sheets

ALTERNATOR AND STARTER TESTER WITH CAPACITIVE ELEMENT

FIELD OF THE DISCLOSURE

The present invention pertains to the field of testing vehicle motor rotary accessory devices. More particularly, the present invention relates to devices for testing alternators or starter motors wherein the devices include a capacitive element.

BACKGROUND OF THE DISCLOSURE

It is well known in the vehicle industry that certain rotary accessory devices are often used in connection with vehicle motors. Two such accessory devices are alternators and starter motors. Alternators are used in connection with an engine and are typically belt driven by the engine. Alternators have internal components, which when rotated supply electrical power to a vehicle battery. Alternators are typically removable but rigidly mounted via a bracket to the engine block or the chassis of the vehicle. In many cases, where a standard type of alternating mounting arrangement is used, the alternator has "ears" with holes that are mounted onto a post or bolt attached to the vehicle. This permits pivoting of the alternator so that the alternator can be pivoted around the post against the belt tension in order to install and remove belts, and provide a suitable tension when the belt is installed.

Starter motors are electrical motors, which are typically removable but rigidly mounted to an engine or transmission casing. The starter motor has an electrically driven pinion gear extending from the starter motor that engages a component (typically gears on the flywheel of the engine) in order to be able to rotate the crankshaft of the engine to start it. There is a wide range of attachment mechanisms for attaching the described starter motor.

Conventional alternator and starter tester may test alternators and/or starter motors using a direct current (DC) power source. For example, the DC power source may be used to power the starter motor and bias the alternator during a testing process. The DC power source may determine the capability of an alternator and starter tester. Oftentimes, the alternator and starter tester requires high power in order to achieve desired accuracy when testing the starter motor or the alternator. The high power required leads to expensive and bulky circuit components which in turn lead to higher cost, size and weight for the alternator and starter tester. Additionally, the high power demand required by the prior art systems resulted in greater power consumption and operating costs. Thus, it would be desirable to have an alternator or starter tester with high accuracy with decreased cost, size and weight.

SUMMARY OF THE DISCLOSURE

The foregoing needs are met, to a great extent, by the present disclosure, wherein in one aspect, an apparatus is provided that in some embodiments an alternator and starter motor tester includes a capacitive element. The capacitive elements may provide an additional source of power that may allow for the use of smaller and less costly circuit components in the starter motor tester. The smaller and less costly circuit components may have reduced power consumption. Finally, the capacitive elements may be sufficiently charged by the smaller circuit components when the starter motor tester is not being utilized.

In accordance with one embodiment of the present disclosure, a diagnostic system configured to test a performance of a vehicle component may include a processor configured to process test information from the vehicle component and control the vehicle component to be tested. The diagnostic system may also include a memory configured to store the test information of the vehicle component and software that operates the vehicle component and a capacitive element configured to supply power to perform the testing of the vehicle component, wherein the memory and the capacitive element are in communication with the processor.

In accordance with another embodiment of the present disclosure, a method of testing of a vehicle component may include receiving, via an input device, a selection of the vehicle component for the testing and identifying, via an interface module, information associated with the vehicle component. The method may also include charging, via a charging module, a capacitive element based at least in part on the information associated with the vehicle component in order to perform the testing of the vehicle component.

In accordance with yet another embodiment of the present disclosure is a diagnostic system configured to test a performance of a vehicle component may include an electrical connection for coupling the diagnostic tool to an external power source and a power supply circuitry for processing power received from the external power source. The diagnostic system may also include a test and control circuitry for controlling the testing of the vehicle component and a capacitive element for receiving processed power from the power supply circuitry to power the testing of the vehicle component.

There has thus been outlined, rather broadly, certain embodiments of the disclosure in order that the detailed description herein may be better understood, and in order that the present contribution to the art may be better appreciated. There are, of course, additional embodiments of the present disclosure that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
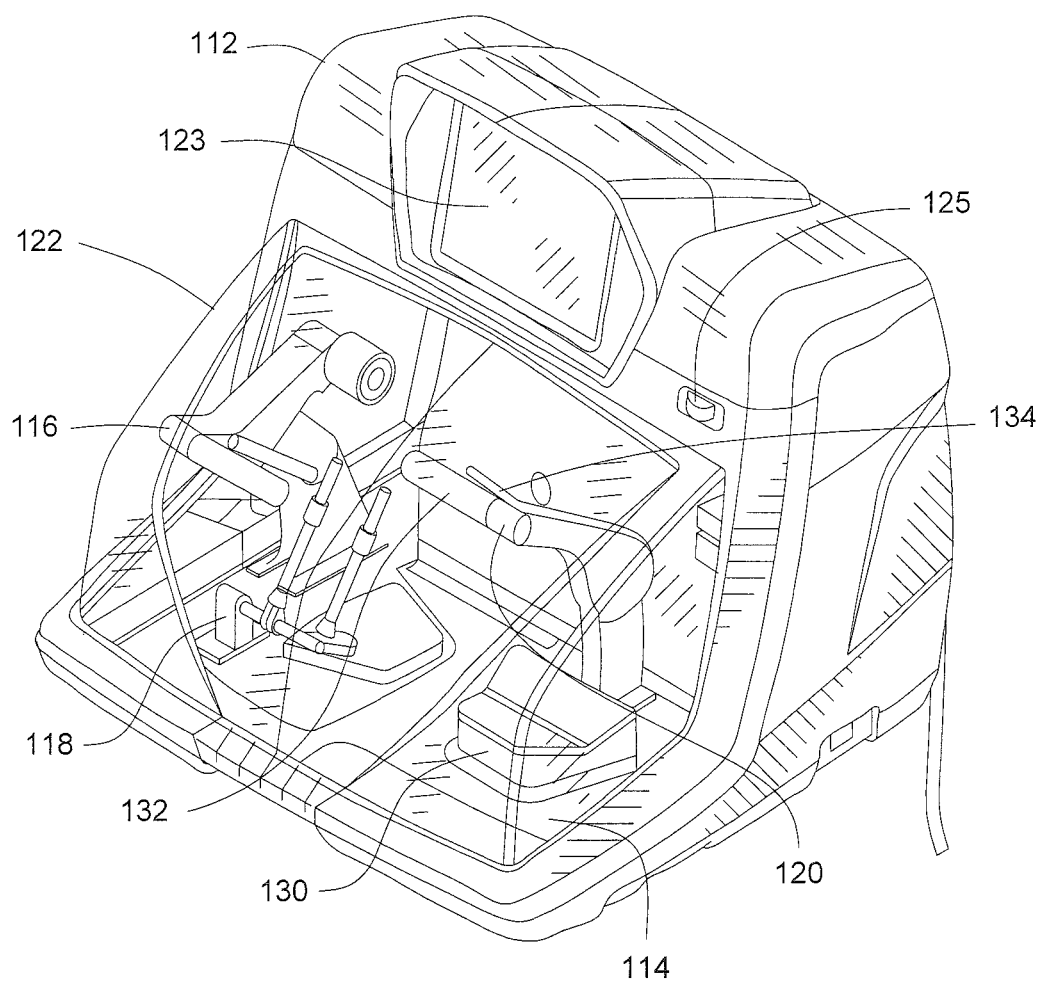
FIG. 1 is a perspective view of an alternator and starter motor tester according to an exemplary embodiment of the present invention.

The present invention will now be described with reference to the drawing figures, in which like reference numerals refer to like parts throughout. An embodiment in accordance with the present invention provides an alternator and starter motor tester for holding and testing an alternator or starter motor. The alternator and starter motor tester includes a protective hood or cover, a controller connecting an LCD touch-screen, a barcode connector, USB host and USB function connectors, an Ethernet connector, and a flash memory connector.

An embodiment of the testing apparatus is illustrated in FIG. 1. FIG. 1 illustrates an alternator and starter motor tester 100 ("tester") including a housing 112 and a base plate (or chassis) 114. The housing 112 surrounds and supports various operative components of the tester 100 including, for example, a power supply, diagnostic electronics, mounting devices, a monitor screen 123, a protective door cover 122, and the like. In one embodiment, the monitor screen 123, e.g., LCD touch-screen, may be disposed within the housing 112. A test power button 125, such as a toggle-switch, is provided on the housing 112 to activate and de-activate test power to the drive motor (not shown) and/or the transformer (not shown). A main power switch (not shown) is also used to provide power to the tester 100.

The tester 100 also includes an alternator belt tensioning arrangement generally designated 116, an alternator mounting arrangement generally designated 118, and a starter motor holder arrangement generally designated as 120. Each of the belt tensioning arrangement 116, the alternator mounting arrangement 118, and the starter motor holder arrangement 120 may be mounted directly to the base plate 114.

The alternator belt tensioning arrangement 116 and the alternator mounting arrangement 118 together hold the alternator in place for testing. An installation assembly that includes one or more mounting pins (not shown) can be placed in the alternator mounting arrangement 118 in order to mount the alternator. The alternator can be horizontally or vertically mounted depending on the type of alternator. The pins are replaceable to allow flexibility for current and future applications.

Additionally, a drive belt (not shown), such as a serpentine or V-type belt or the like, can be connected to the alternator and the drive motor to simulate the operating environment in the vehicle. A gas piston may be used for belt tension to ensure consistent belt tension during testing, thereby eliminating over tensioning or belt slippage that may affect test results.

The starter motor holder arrangement 120 includes a quick release ratchet system, wherein the starter is placed on a pad and held in place by the ratchet system. The starter motor holder arrangement 120 includes, a support pad 130, a handle 132 and a release lock 134 that when operated engages and disengages a lock (pawl, for example) from a ratchet (both not shown). The starter motor holder arrangement 120 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad 130 for testing. Upon the placement, the operator squeezes the release lock 134 and presses down on the handle 132 to engage the starter motor and then releases the lock so that the lock is again reengaged. The starter motor may be powered by a transformer (not shown) in order to simulate operating environments. The transformer may be powered by an external power source and may provide test power to the starter motor via a heavy duty cable and clamps.

FIG. 1 also illustrates the monitor screen 123 that can operate as a touch-screen LCD user interface that communicates with a controller (discussed below) as well as to display information to the end user. The present invention also utilizes an on-line tutorial for quickly training new personnel on the unit's functionality and on-line help screens to help new users navigate and test components during a test. The monitor screen 123 may offer step-by-step instructions for setting up the tester 100 and conducting tests. The monitor screen 123 may also display on-screen hook up diagrams and a specification library database, which eliminate the need for paper flipcharts and enables software updates for new alternator applications or starter configurations. This database can be updated by compact flash, flash drive, other memory media or remotely via a network connection (discussed below). The monitor screen 123 may allow end users to run advertising screens when the tester is not in use. These screens can be uploaded to the tester 100 from an end user's network server or uploaded from a compact flash or other memory media. Additionally, the monitor screen 123 may be capable of displaying information in various updatable languages.

The tester 100 may output "Good/Bad" or "Pass/Fail" results to the end user. An end user printout that details test results and provides technical advice for other potential problems can be provided to the end user.

Figure 2:
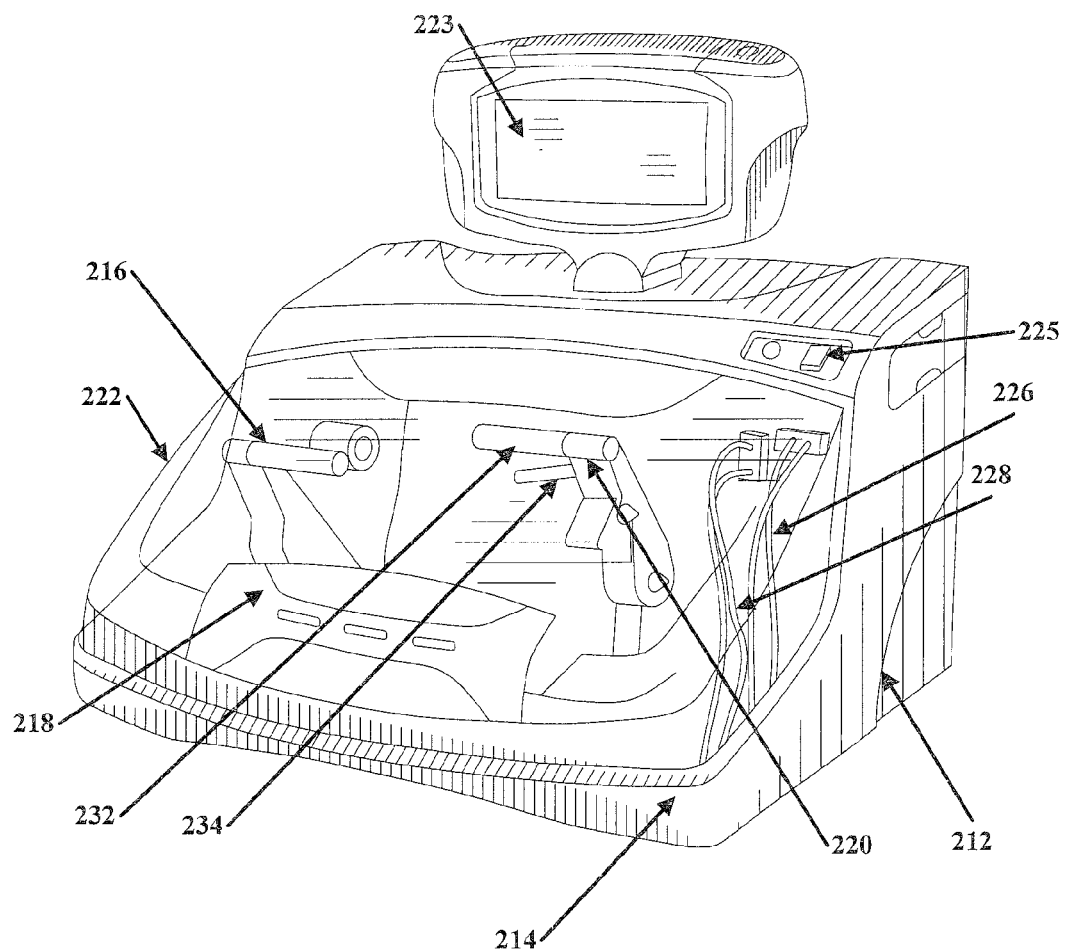
FIG. 2 is a perspective view of the alternator and starter motor tester according to an exemplary embodiment of the present invention.

Turning now to FIG. 2, a perspective view of the alternator and starter motor tester 200 according to another exemplary embodiment of the present disclosure is illustrated. The alternator and starter motor tester 200 ("tester") has components similar to the tester 100 depicted in FIG. 1, however it has an alternative design. For example, tester 200 includes a housing 212 and a base plate (or chassis) 214. The housing 212 surrounds and supports various operative components of the tester 200 including, for example, a power supply, diagnostic electronics, mounting devices, a monitor screen 223, a protective door cover 222, and the like. In the embodiment depicted, the monitor screen 223, is an LCD touch-screen disposed within the housing 212. A power button 225, such as a toggle-switch design, is provided on the housing 212 to activate or deactivate test power to the driver motor (not shown) and/or the transformer (not shown). A main power switch (not shown) is also used to provide power to the tester 200.

The tester 200 also includes an alternator belt tensioning arrangement generally designated 216, an alternator mounting arrangement generally designated 218, and a starter motor holder arrangement generally designated as 220. Each of the belt tensioning arrangement 216, the alternator mounting arrangement 218, and the starter motor holder arrangement 220 may be mounted directly to the base plate 214.

The test adapters 226 and power leads 228 may be connected to the alternator or starter motor in order to provide test information to tester 200. Additionally, a drive belt (not shown), such as a serpentine or V-type belt or the like, can be connected to the alternator and drive motor to simulate the operating environment in the vehicle. A gas piston may be used for belt tension to ensure consistent belt tension during testing and thereby eliminating over tensioning or slipping belts that may affect test results.

The starter motor holder arrangement 220 includes a quick release ratchet system, wherein the starter is placed on a pad and held in place by the ratchet system. The starter motor holder arrangement 220 includes, a handle 232 and a release lock 234 that when operated engages and disengages a lock (pawl, for example) from a ratchet (both not shown). The starter motor holder arrangement 220 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed in the tester 200 for testing. Upon the arrangement, the operator squeezes the release lock and presses down on the handle 232 to engage the starter motor and then releases the lock so that the lock is again reengaged. Power leads 228, including, for example, battery lead, ground lead, solenoid lead and sense lead are connected to the starter motor in order to conduct the tests.

In the embodiment depicted in FIG. 2, the tester 200 may incorporate enhanced safety features, such as the protective door cover 222 to enclose moving parts during tests. The protective door cover 222 conceals the belt tensioning arrangement 216, the alternator mounting arrangement 218, the starter motor holder arrangement 220, and other test components, such as an alternator or starter motor in the closed position.

In the closed position, the protective door cover 222 reduces the likelihood of the possibility of hands getting caught in moving parts or projectiles potentially contacting the end user. The protective door cover 222 may employ a door interlock switch (not shown) to disable tests while the protective door cover 222 is open. Alternatively, the protective door cover 222 may include a viewing window so that the operator can observe the components during the tests.

Figure 3:
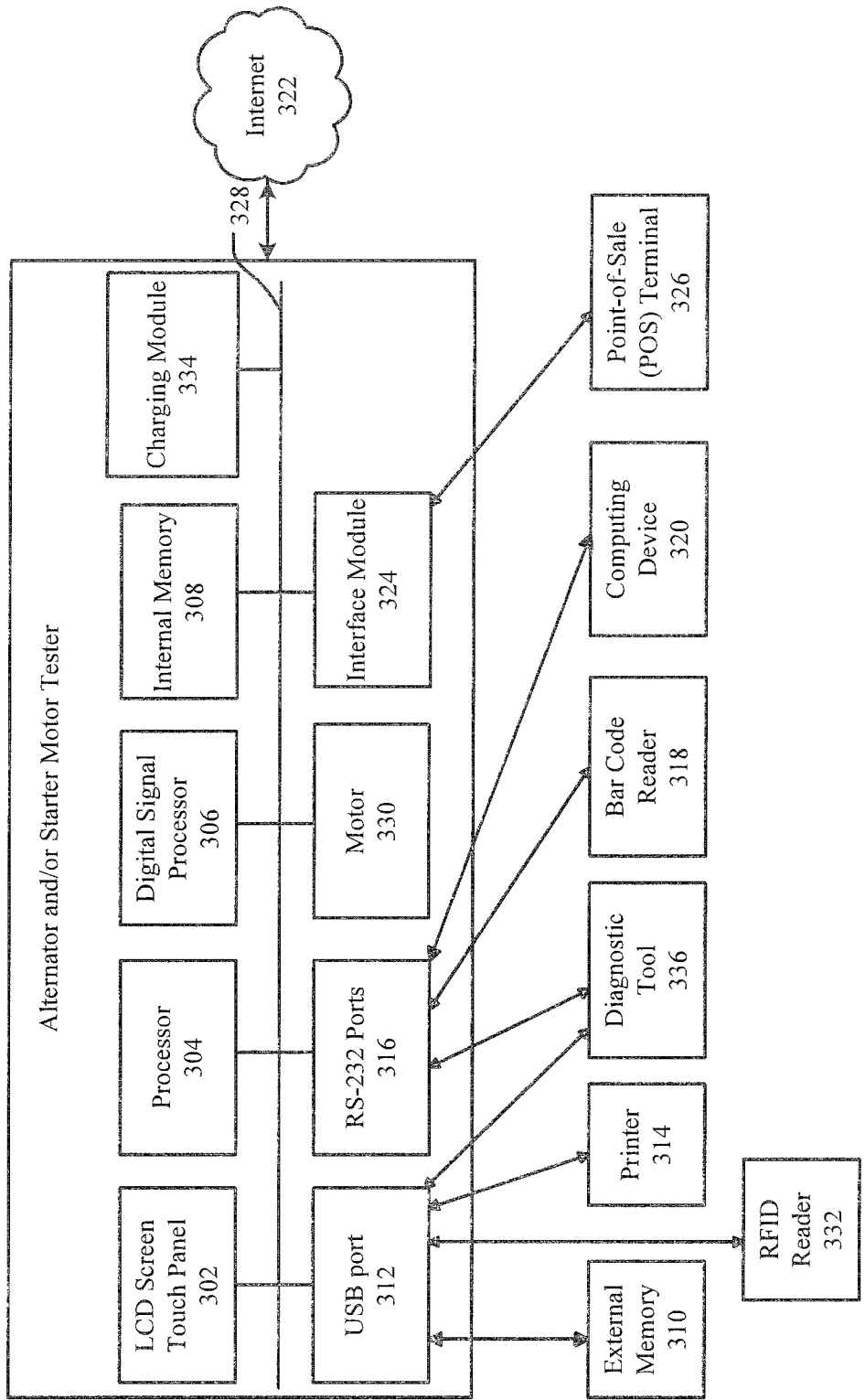
FIG. 3 is a block diagram of the main components of the alternator and starter motor tester according to an exemplary embodiment of the present invention.

FIG. 3 is a block diagram 300 of the components of the alternator and starter motor tester as previously described and shown in FIGS. 1-2 according to an exemplary embodiment of the present invention. The components generally include a monitor screen, such as LCD screen 302 that may present various information to the user. The LCD screen 302 may be a touch panel to input information as desired by the user and can be controlled by a processor 304. The processor 304 may be any processor or controller, including a FPGA (Field Programmable Gate Array) or application-specific integrated circuit (ASIC). The processor 304 is capable of running various OS (Operating System) including Linux, Apple Computer's Operating System (such as OS X), Windows, Windows CE and the like. The processor 304 communicates with a digital signal processor 306, which includes an analog and digital (A/D) converter. The processor 304 communicates with other components (e.g., internal memory 308, USB port 312, RS-232 ports 316, motor 330, interface module 324 and/or charging module 334) of the tester 100 via a communication bus 328.

The processor 304 is configured to communicate with an internal memory 308 and an external memory 310. The internal memory 308 and/or the external memory 310 can be any memory including, for example, compact flash, SD (secure digital), USB flash drives, and the like. A universal serial bus (USB) port 312 communicates with the processor 304 and provides a connection for various USB compatible devices, such as, for example, the external memory 310, a printer 314, a radio frequency identification (RFID) reader 332 and/or a diagnostic tool 336. The RFID reader 332 functions to read identifying information about the tested component containing an RFID chip once it is within a detection range. The RFID chip may be integrated or separated from the tested component. The RFID chip may contain information about the alternator or starter motor such as alternator/starter motor type, serial number, manufacturer, date of production or shipment, previous test results, electrical specifications, maintenance information, serial number, lot number, warranty information, a manufacture data code, method of shipment and the like.

RS-232 ports 316 also communicate with other external devices, such as a computing device 320, a bar code reader 318 and/or the diagnostic tool 336. The computing device 320 can be any computing device, including a personal computer, a laptop, a tablet, a personal digital assistant (PDA), a cell phone or the like. In another embodiment, the ports 312 and 316 may accommodate a data cable that may connect to a data link connector in a vehicle to retrieve diagnostic information, such as diagnostic trouble codes (DTCs).

The bar code reader 318 allows the user to scan bar code information that may be attached to the tested component or the VIN (vehicle identification number) of the vehicle from which the tested component came from. The bar code reader 318 may be, for example, a conventional optical bar code reader, such as a gun or wand type reader.

During operation, the end user swipes or aims the bar code reader 318 over the bar code that is associated with the particular alternator or starter motor to be tested and reads the bar code accordingly. The bar code itself may be affixed to the alternator or starter motor at the time of manufacture, purchase, shipment or service. The bar code may contain information, or point to information stored in a database. The database may be local (e.g., internal memory 308) or remotely (e.g., external memory 310) located and accessible by the Internet, Ethernet, Wi-Fi, LAN, Bluetooth or other wireless or a wired connection. The data provided by the bar code is not limited to the examples given.

The interface module 324 may comprise a database (or access the internal memory 308 or the external memory 310 that stores the database) for storing information associated with the tested components and information associated with the diagnostic test performed by the tester 100. The information associated with the tested components may include, but not limited to, alternator/starter type, serial number, manufacturer, date of production or shipment, previous test results, electrical specifications, port connections, electrical configuration/layout, diagnostic specification, maintenance information, serial number, lot number, warranty information, a manufacture data code, method of shipment and the like. The information associated with the diagnostic test performed by the tester 100 may include, but not limited to, test specification, test values, test results (including previous test results), data, time, employee, location, weather condition during testing (extreme cold or heat that may affect the test) and/or any other information associated with the diagnostic test.

The bar code may provide a variety of information regarding the alternator or starter motor to be tested. For example, the bar code may provide information regarding the alternator/starter motor type, serial number, manufacturer, date of production or shipment, previous test results, electrical specifications, maintenance information, serial number, lot number, warranty information, a manufacture data code, method of shipment and the like. This data can be used to select parameters for the test cycle run to test the alternator and starter motor.

In some embodiments, the printer 314 may print bar code labels that may be attached or otherwise associated with the alternator or starter and provides updated information about the component. The updated information may include, among other things, service dates, service procedures (including the results), and warranty information (e.g., time left on warranty, who was the original purchaser, what types of service are and are not warranted, etc.). The printed label may then be read by the bar code reader 318 in subsequent tests. These features can eliminate possible typographical errors during manual input and by speeding up part number selection and entry by having a scanning capability.

The present disclosure also has the ability to store and display or print technical bulletins associated with specific part numbers of components to be tested. Printouts of test results can give rebuilders access to data obtained by users to assist in the further analysis of that component.

The interface module 324 may communicate with external devices coupled to the tester 100. For example, the interface module 324 may communicate and receive identification information of the alternator or starter motor to be tested from the bar code reader 318, the RFID reader 332, and/or a POS terminal 326 through a direct or indirect connection. In an exemplary embodiment, the interface module 324 may communicate with the bar code reader 318 and receive bar code identification information of the alternator or starter motor to be tested. In another exemplary embodiment, the interface module 324 may communicate with the RFID reader 332 and receive RFID identification information of the alternator or starter motor to be tested. In other exemplary embodiment, the interface module 324 may communicate with the POS terminal 326 and receive identification information of the alternator or starter motor to be tested inputted by a user.

The interface module 324 may communicate with a charging module 334 that may control charging of a capacitive element (610 of FIG. 6) of the tester 100. For example, the interface module 324 may provide an electrical specification of the alternator or starter motor to be tested to the charging module 334 and the charging module 334 may charge the capacitive element based at least in part on the supplied electrical specification. The charging module 334 may charge a capacitive element of the tester 100 before testing of the alternator and/or starter motor. The charging module 334 may control an amount of power that is supplied to the capacitive element based at least in part on the alternator or starter motor to be tested. For example, an alternator or starter motor to be tested may require a smaller amount of power, the charging module 334 may supply the smaller amount of power to the capacitive element. While, an alternator or starter motor to be tested may require a larger amount of power, the charging module 334 may supply the larger amount of power to the capacitive element.

The charging module 334 may control a timing to charge the capacitive element of the tester 100. For example, the charging module 334 may supply a constant voltage potential and/or current to the capacitive element of the tester 100. The charging module 334 may start charging the capacitive element closer to the start of the test when an alternator or starter motor to be tested may require a smaller amount of power. While, the charging module 334 may start charging the capacitive element at an earlier time before the start of the test when an alternator or starter motor to be tested may require a larger amount of power. In another example, the charging module 334 may supply a variable voltage potential and/or current to the capacitive element of the tester 100. The charging module 334 may determine a charge time based at least in part on the variable voltage potential and/or current and the amount of charge required to test an alternator and/or a starter motor.

The charging module 334 may charge the capacitive element of the tester 100 continuously or intermittently. For example, the charging module 334 may continuously charge the capacitive element of the tester 100 in order to maintain the charged voltage potential of the capacitive element. In another exemplary embodiment, the charging module 334 may monitor a voltage potential stored in the capacitive element and may intermittently charge the capacitive element when the voltage potential stored in the voltage potential drops to a voltage charging threshold.

The charging module 334 may verify whether the capacitive element is properly charged based at least in part on the information of the alternator or starter motor to be tested. For example, the charging module 334 may detect the output voltage potential and/or current of the capacitive element and determine whether the detected output voltage potential and/or current matches an expected voltage potential and/or current stored in a data of either the internal memory 308 or the external memory 310.

The charging module 334 may also monitor an output voltage potential and/or current of the capacitive element of the tester 100 during the diagnostic test. The charging module 334 may determine when to couple a power source during the diagnostic test based at least in part on the output voltage potential and/or current of the capacitive element. For example, when the output voltage potential and/or current of the capacitive element is below a threshold output power level during a diagnostic test, the charging module 334 may determine to couple power to the tester 100 from the external power source (e.g., A/C or DC power source). In an exemplary embodiment, the charging module 334 may continue to supply power from the capacitive element in addition to the power supplied by the power source during the diagnostic test. In another exemplary embodiment, the charging module 334 may discontinue to supply power from the capacitive element once the power is supplied during the diagnostic test. The output threshold power level may be determined based at least in part on a power rating of the tester 100 and/or tested components.

The processor 304 can also interact with a networked computer, LAN (local area network), a smartphone, cellular phone or a distributed network, such as the Internet 322 and the like. This connection allows the user to update the tester 100 and also send information regarding the test results to a remote location. The information sent or received may include, software, firmware, language, weather reports and database for the components to be tested or to the tester 100.

A motor 330 is also provided in order to test alternators. Motor 330 can simulate the engine of a vehicle and includes a pulley to mate with a belt. At one end, the belt is coupled to the motor's 330 pulley and at the other end is coupled to the pulley of the alternator to be tested.

Figure 4:
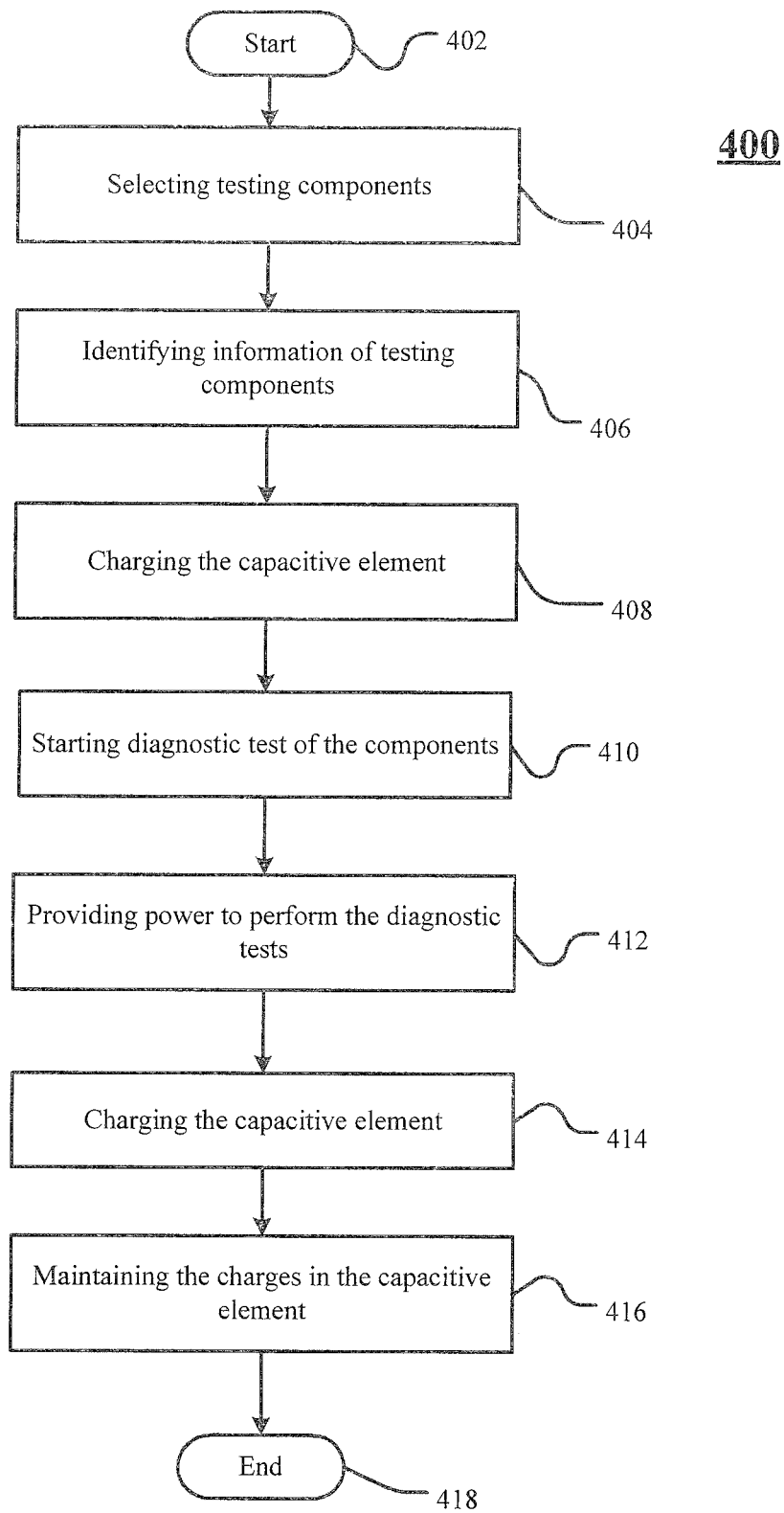
FIG. 4 illustrates a method for charging an alternator and starter motor tester according to an exemplary embodiment of the present invention.

FIG. 4 illustrates a method 400 for conducting a diagnostic test by the alternator and starter motor tester 100 according to an embodiment of the present invention. This exemplary method 400 may be provided by way of example, as there are a variety of ways to carry out the method. The method 400 shown in FIG. 4 can be executed or otherwise performed by one or a combination of various systems, such as, the system and networks shown in FIGS. 1-3, 5 and 6, by way of example. Each block shown in FIG. 4 represents one or more processes, methods, or subroutines carried out in exemplary method 400 and the steps are not limited to the order shown in the figure. Referring to FIG. 4, exemplary method 400 may begin at step 402.

Starting at step 402, the user selects the component or the part to test at step 404 through an input device, such as the LCD screen 302 or the bar code or RFID chip. At step, 406, the interface module 324 identifies information associated with the tested components. For example, the interface module 324 may identify a power level (e.g., voltage potential and/or current) at which the tested component should be tested at. At step 408, the charging module 334 may start charging the capacitive element of the tester 100 based at least in part on the information associated with the tested components. In an exemplary embodiment, the charging module 334 may charge the capacitive element before a diagnostic test performed by the tester 100. In another exemplary embodiment, the charging module 334 may charge the capacitive element during a diagnostic test performed by the tester 100. The charging module 334 may charge the capacitive element for a period of time until the capacitive element reaches a power level to start the diagnostic test.

The capacitive element may be used to start the diagnostic test at step 410. The capacitive element may supply power to the tester 100 to start the diagnostic test of components to be tested. The charging module 334 may monitor an output voltage potential and/or current of the capacitive element. The charging module 334 may couple a power source to continue the diagnostic test of the components to be tested at step 412, when the output voltage potential and/or current falls to a testing threshold power level. After coupling the power source to perform the diagnostic test, the charging module 334 may decouple the capacitive element as a power source. In another example, the capacitive element may continue to provide power to the diagnostic test, after the charging module 334 couples the power source to perform the diagnostic tests. By coupling the power source with the capacitive element to supply a power to the tester 100, the tester 100 may test a component that may require higher power than the power source is able to supply. After the completion of the diagnostic test, the charging module 334 may charge the capacitive element for the next diagnostic test at step 414.

The charging module 334 may maintain the voltage potential stored in the capacitive element at step 416. For example, the charging module 334 may continuously supply a voltage potential and/or current to the capacitive element to replenish charges leaked in order to maintain a voltage potential stored in the capacitive element. In another example, the charging module 334 may intermittently supply a voltage potential and/or current to the capacitive element when the voltage potential stored in the capacitive element drops to a charging threshold power level due to leakage of charges to maintain a voltage potential stored in the capacitive element.

Figure 5:
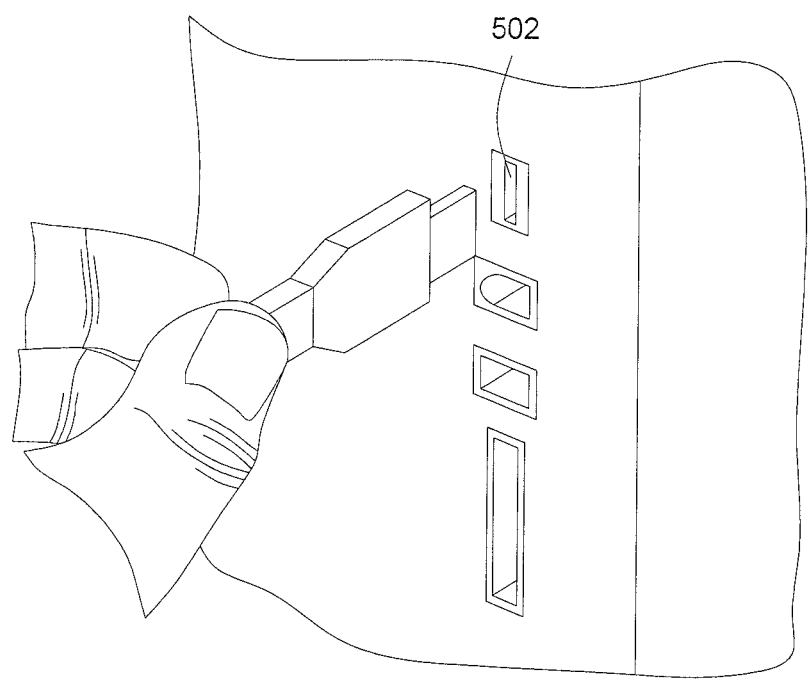
FIG. 5 is a perspective view of the peripheral and remote connections of the alternator and starter motor tester according to an exemplary embodiment of the present invention.

Referring to FIG. 5, in some embodiments of the alternator and starter motor tester, network connectivity may be used to track tests based on part number, employee and location in order to improve accuracy of the diagnostic test. The large-scale communication network ports can be constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The information relayed can include data from the result of an alternator or starter test, the part's warranty information, the part type, the part make and model, previous tests, updates, diagnostic or operating parameters of the alternator and starter tester, maintenance data of the alternator and starter tester, and any other data required by the operator.

Referring to FIG. 5, in some embodiments, peripheral module ports 502 may be used to communicate to various peripheral devices such as a mouse, a keyboard, or a printer as well as to receive updates and/or downloads from a connected device such as a laptop or personal computer. The peripheral module ports 502 may be a USB module having ports for a host connection and a function connection. The USB module may communicate as USB 1.1 or USB 2.0, 3.0 or other data rates. The peripheral module ports 502 may accommodate a mouse, a keyboard, or a printer. The function connection may accommodate a laptop or personal computer. The peripheral module ports 502 may also include a cable connection that may allow communication between the tester 100 and a vehicle.

Figure 6:
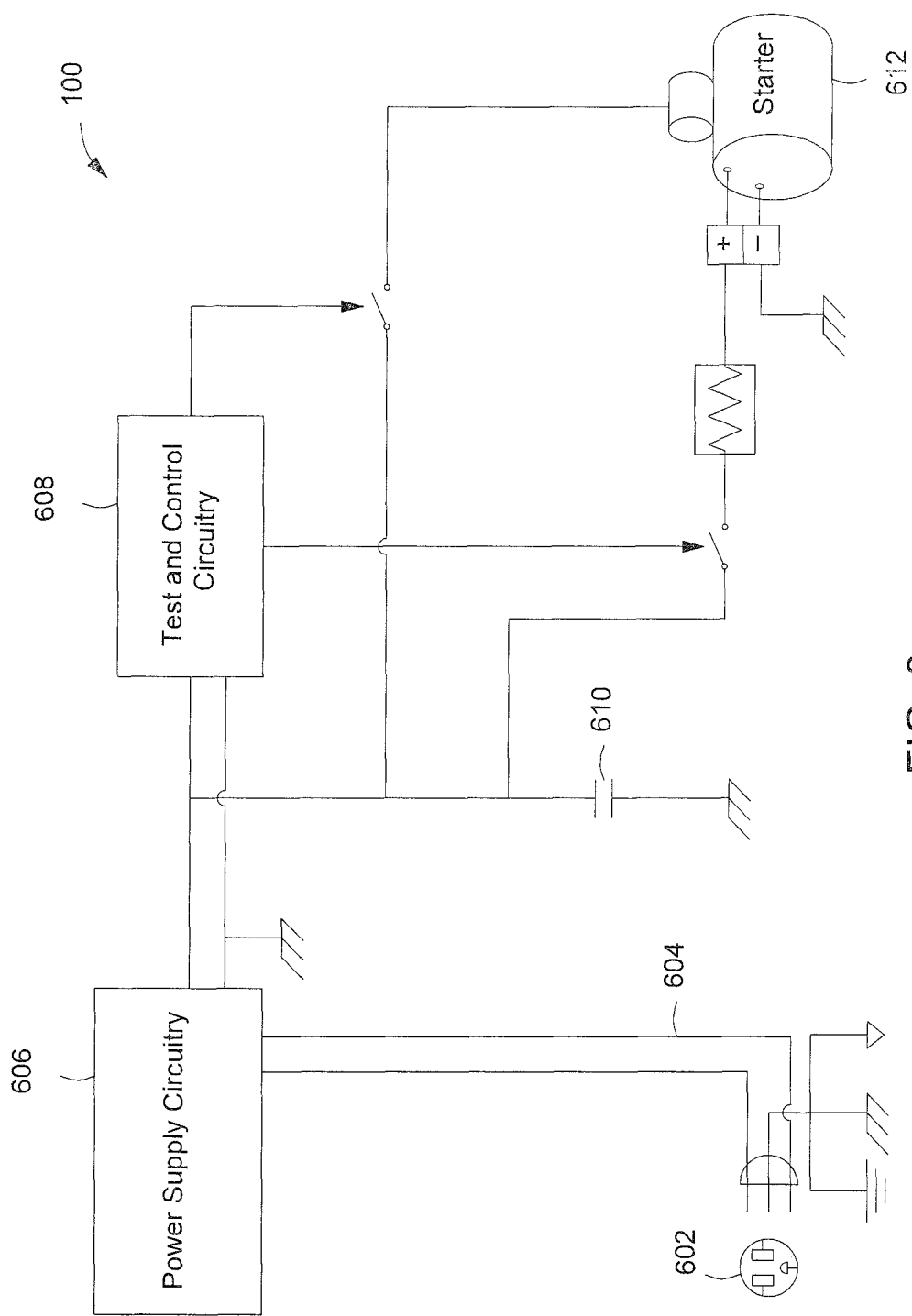
FIG. 6 illustrates a circuit schematic diagram of the alternator and starter motor tester according to an exemplary embodiment of the present invention.

FIG. 6 illustrates a circuit schematic diagram of an alternator and starter motor tester 100 according to an embodiment of the present disclosure. The tester 100 may be coupled to an external power source 602 (e.g., an alternating current (AC) power source) via an electrical connection 604. In an exemplary embodiment, the external power source 602 may be a 120V alternating current (AC) and 20 A power source to power an operation of the tester 100. The tester 100 may also include a power supply circuitry 606. The power supply circuitry 606 may include a transformer circuitry and a rectifier circuitry (not shown) for converting the power received from the external power source 602 into a power that may be used by the tester 100. In an exemplary embodiment, the transformer circuitry of the power supply circuitry 606 may convert the 120V alternating current (AC) power signal to a 12V alternating current (AC) power signal. The rectifier circuitry (not shown) of the power supply circuitry 606 may convert (e.g., rectify) the 12V alternating current (AC) power signal to a 12V direct current (DC) power signal to power the tester 100.

For example, the power supply circuitry 606 may supply power to test and control circuitry 608 and a capacitive element 610 to run a starter motor 612 in order to perform a diagnostic test on an alternator or a starter motor. For example, the capacitive element 610 may be a high energy density (HED) capacitive element including, but not limited to, an ultracapacitor, a supercapacitor, electrochemical double layer capacitor (EDLC), a thin-film capacitor or any other high energy density (HED) capacitor. If ultracapacitors are implemented, the ultracapacitors may include a double-layer structure that polarizes an electrolytic solution to store energy electrostatically. However other types of ultracapacitor arrangements are contemplated as well. For example, the capacitive element 610 may be one or more ultracapacitors such as the ultracapacitors manufactured by Maxwell Technologies, San Diego, Calif., USA.

The capacitive element 610 may be configured to have sufficient capacitance as required to run the starter motor 612 for a period of time (e.g., several seconds) in order to test an alternator or a starter motor. For example, the capacitive element 610 may be a single capacitor element or a plurality of capacitor elements coupled to each other in parallel configuration to provide additional voltage and/or energy storage. Additionally or alternatively, the capacitor elements may be arranged in a series configuration to achieve a higher operating voltage potential. In an exemplary embodiment, the capacitive element 610 may be a capacitive module having a plurality of individual capacitors connected in series and parallel to each other via bus bar connections. In an exemplary embodiment, the capacitive element 610 may be configured to store sufficient charge (e.g., 12V) to run the starter motor 612 for a period of time. For example, the capacitive element 610 made be configured with six 100F 2.7 volt capacitors in series; and may be in parallel with another six 100F 2.7 volt capacitors in series. Of course, numerous other arrangements are contemplated as well.

The power supply circuitry 606 may supply power to the capacitive element 610 between tests of an alternator and/or a starter motor. The capacitive element 610 may discharge stored charges to run the starter motor 612 during testing. For example, an advantage of the capacitive element 610 is that the power supply circuitry 606 may have a lower current capacity than existing alternator and starter motor testers because the existing alternator and starter motor testers includes a transformer that requires higher current capacity (e.g., voltage and current for 5 seconds) to run the test. The capacitive element 610 may require lower current capacity because the capacitive element 610 may be charged for a longer period of time (e.g., at least a minute or two) between tests. In another example, the capacitive element 610 may eliminate the redundancy of two power supply circuitry 606 for separately supplying power to the test and control circuitry 608 and the starter motor 612. By using the capacitive element 610, the redundancy of the power supply circuitry 606 may be eliminated because the power supply circuitry 606 may supply power to both the test and control circuitry 608 and the capacitive element 610.

As described above, the capacitive elements may provide an additional source of power that may allow for the use of smaller and less costly circuit components in the starter motor tester; the smaller and less costly circuit components may have reduced power consumption; and the capacitive elements may be sufficiently charged by the smaller circuit components when the starter motor tester is not being utilized.

The many features and advantages of the present disclosure are apparent from the detailed specification, and thus, it is intended by the appended claims to cover all such features and advantages of the present disclosure, which fall within the true spirit, and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

What is claimed is:

1. A diagnostic tool configured to test a performance of a vehicle component, the diagnostic tool comprising:
   a processor configured to process test information from the vehicle component and control the vehicle component to be tested;
   a memory configured to store the test information of the vehicle component and software that operates the vehicle component; and
   a capacitive element configured to supply power to perform the testing of the vehicle component, wherein the memory and the capacitive element are in communication with the processor.

2. The diagnostic tool of claim 1, wherein the vehicle component is a starter motor component and the processor is also configured to control the starter motor and process starter motor information.

3. The diagnostic tool of claim 1, wherein the vehicle component is an alternator and the processor is also configured to control the alternator and process alternator information.

4. The diagnostic tool of claim 1, further comprising a charging module that controls a timing and an amount of charge provided to the capacitive element.

5. The diagnostic tool of claim 4, wherein the charging module charges the capacitive element with a constant voltage potential and/or current.

6. The diagnostic tool of claim 4, wherein the charging module charges the capacitive element with a variable voltage potential and/or current.

7. The diagnostic tool of claim 4, wherein the charging module charges the capacitive element based at least in part on an amount of power required to perform the testing of the vehicle component.

8. The diagnostic tool of claim 1, further comprising an interface module configured to receive identification information of a component of the vehicle to be tested.

9. The diagnostic tool of claim 8, wherein the interface module is configured to receive the identification information from a barcode reader, a RFID reader or a point-of-sale (POS).

10. The diagnostic tool of claim 1, wherein the test information includes at least one of the following: test specification, test values, test results, data, time, employee, location and weather condition.

11. The diagnostic tool of claim 1, wherein the capacitive element comprises a plurality of capacitive elements.

12. A method of testing a vehicle component, comprising the steps of:
    receiving, via an input device, a selection of the vehicle component for testing;
    identifying, via an interface module, information associated with the vehicle component; and
    charging, via a charging module, a capacitive element based at least in part on information associated with the vehicle component in order to perform the testing of the vehicle component.

13. The method of claim 12, wherein identifying information associated with the vehicle component comprises identifying a power level at which the vehicle component should be tested at.

14. The method of claim 12, wherein charging the capacitive element comprises charging the capacitive element before performing the testing of the vehicle component.

15. The method of claim 12, wherein charging the capacitive element comprises charging the capacitive element during the testing of the vehicle component.

16. The method of claim 12, further comprising starting the testing of the vehicle component using the capacitive element.

17. The method of claim 12, further comprising coupling a power source to perform the testing of the vehicle component.

18. The method of claim 17, wherein the power source is coupled when an output voltage potential and/or current falls to a testing threshold power level.

19. The method of claim 12, further comprising charging the capacitive element after completion of the testing of the vehicle component.

20. A diagnostic tool for testing a performance of a vehicle component, comprising:
    an electrical connection for coupling the diagnostic tool to an external power source;
    a power supply circuitry for processing power received from the external power source;
    a test and control circuitry for controlling the testing of the vehicle component; and a capacitive element for receiving processed power from the power supply circuitry to power the testing of the vehicle component.

\* \* \* \* \*